METHOD OF MAKING MULTI-LAYER CIRCUIT

Original Filed Oct. 22, 1965

INVENTORS

HAROLD LALMOND
LEWIS B. GOODY

BY Philip D. Amins

ATTORNEY

Dec. 15, 1970 H. LALMOND ET AL 3,546,775

METHOD OF MAKING MULTI-LAYER CIRCUIT

Original Filed Oct. 22, 1965 2 Sheets-Sheet 2

INVENTORS

HAROLD LALMOND
LEWIS B. GOODY

BY Philip D. Amins

ATTORNEY

United States Patent Office
3,546,775
Patented Dec. 15, 1970

3,546,775

METHOD OF MAKING MULTI-LAYER CIRCUIT

Harold Lalmond and Lewis B. Goody, Nashua, N.H., assignors to Sanders Associates, Inc., Nashua, N.H., a corporation of Delaware Original application Oct. 22, 1965, Ser. No. 501,199, now Patent No. 3,383,564. Divided and this application Mar. 4, 1968, Ser. No. 751,320
Int. Cl. H02g *15/00*
U.S. Cl. 29—625 10 Claims

ABSTRACT OF THE DISCLOSURE

The present disclosure pertains to a method of making a three-dimensional circuit matrix which matrix comprises a circuit portion formed of a plurality of printed circuit layers insulatively separated from one another and end flaps extending from the circuit portion and enclosing take-off leads connected to the circuit layers; the end flaps enabling the circuit portion to be connected to externally disposed electrical apparatus.

This invention relates to multi-layer circuits and more particularly to an arrangement of terminal leads connected to a circuit matrix made up of a number of layers of electrical circuits.

The present application is a division of our co-pending application, Ser. No. 501,199 filed Oct. 22, 1965, now Pat. No. 3,383,564, and entitled "Multilayer Circuit."

Heretofore, three-dimensional circuit networks have been fabricated by assembling layers of insulating boards upon which are laid down electrical conductors and terminals in such a manner that upon assembly of the boards one upon another with suitable electrical connections between the boards, the three-dimensional circuit network is formed. One particularly useful type of three-dimensional circuit includes as one of the circuit layers a flexible strip of dielectric upon which is laid down a circuit at one end and extending from the circuit along the length of the rest of the strip are electrical leads which serve to connect the assembled three-dimensional circuit to external loads and sources. Such a circuit is sold under the trademark "Flex-Max" and is the product of Sanders Associates, Inc. of Nashua, N.H.

The Flex-Max multi-layer three-dimensional circuit generally includes a circuit portion made up of a multitude of layers, all of substantially the same size, upon which are imposed, by electrolytic plating or by printing or by any of a variety of well-known techniques for forming, what are generally referred to as printed circuits. One of the layers, usually the middle layer, extends as a flap which carries electrical take-off leads from the three-dimensional circuit. Thus, electrical connections to and from the three-dimensional circuit are made via the leads carried by the flap extending from the one circuit layer. The other circuit layers must connect to this one circuit layer via posts or terminals which extend between the layers generally oriented transverse to the layers.

It is an object of the present invention to provide a three-dimensional circuit with a plurality of layers of take-off leads extending from each of at least two sides thereof.

It is another object of the present invention to provide a method for making a three-dimensional circuit matrix comprising a multitude of circuit layers with a plurality of take-off flaps extending from each of at least two sides thereof.

It is another object to provide a method for making a three-dimensional circuit whereby the necessity of inserting posts or terminals to connect the circuit layers after the layers are formed is eliminated.

In accordance with features of the present invention, the three-dimensional circuit matrix is formed by stacking a plurality of circuit layers one upon another, the electrical conductor layers being formed so that they are separated by suitable dielectric material which is preferably mechanically flexible. In a preferred embodiment, each circuit layer includes at least one take-off flap which carries leads that extend external of the circuit so that a multitude of take-off flaps are provided permitting a reduction in the number of electrical connections between the circuit layers.

In preferred embodiments, the outer circuit layers disposed on each side of the middle or inner circuit layer are formed by laying down conductive material on the dielectric layers enclosing the middle circuit layer in such a manner that the outer circuit layers contact the middle circuit layer at preselected points to provide electrical connections therebetween.

The method of construction of the multi-flap matrix is such as to form a completely sealed enclosure of flexible dielectric material about the circuit matrix and also insure a sealed bond between the adjacent flaps. This bond is of sufficient strength and toughness so as not to tear loose when the flaps are separated and subjected to routine and mechanical manipulation such as occurs at installation. The preferred method of fabrication of the multi-flap matrix is first to form the middle or base circuit layer and leads on a strip of flexible dielectric material in which holes have been made at pre-selected points at which the electrical connections between the circuit layers are to be effected. This base circuit layer and leads may be formed by electroplating, printing or any of a variety of well-known techniques for forming printed circuits. The middle circuit is next covered with a layer of dielectric which also has holes at pre-selected points where connections between layers are to be made, forming the base layer assembly. Thereafter, top and bottom cover layers are added, each also including holes at pre-selected points at which connections between layers are to be made. These cover layers are attached to the base layer assembly only along the circuit portion thereof, and so a multitude of loose flaps are formed extending from opposite sides of the circuit portion of the base assembly. The top and bottom circuit layers are then laid down on the outside of the top and bottom cover strips by, for example, electrolytic plating with metal after suitable treatment of the surfaces of these cover strips. Selective removal of the metal forms the circuit and leads. In the course of electrolytic plating, the holes in the circuit portion of the dielectric strips are plated providing electrical connections between the circuit layers. Finally, a dielectric layer applied to the outside of the cover layers seals the outer circuit layers and insulates them from the external environment. The resulting matrix includes a circuit section comprised of a multitude of layers of circuits with suitable connections therebetween and at least one flap of electrical leads extending from each layer, the flaps being flexible and independently movable, yet completely sealed one from the other.

Specific embodiments of the present invention employ as the dielectric material a relatively flexible dielectric such as polyimide and the sealing material may be the well-known thermoplastic Teflon denoted FEP. More particularly, a laminate of polyimide-teflon FEP sold by E. I. Du Pont under the trade name "Kapton" is suitable. The polyimide material is not affected by elevated temperatures on the order of 700° F.; however, the Teflon FEP becomes plastic at a temperature in excess 100° F. lower than this and flows to form a seal. When the polyimide-Teflon laminate is employed, the adjacent flaps are prevented from sealing at the elevated temperature by, for example, providing a non-bonding polyimide to polyimide surface or, as a secondary method, by inserting a thin aluminum foil or other thin non-bonding plastic film such as Teflon TFE therebetween, along the flaps mentioned above.

Other features and objects of the present invention will be apparent from the following specific description taken in conjunction with the figures in which.

Figures 1, 2, 3, 4, 5:
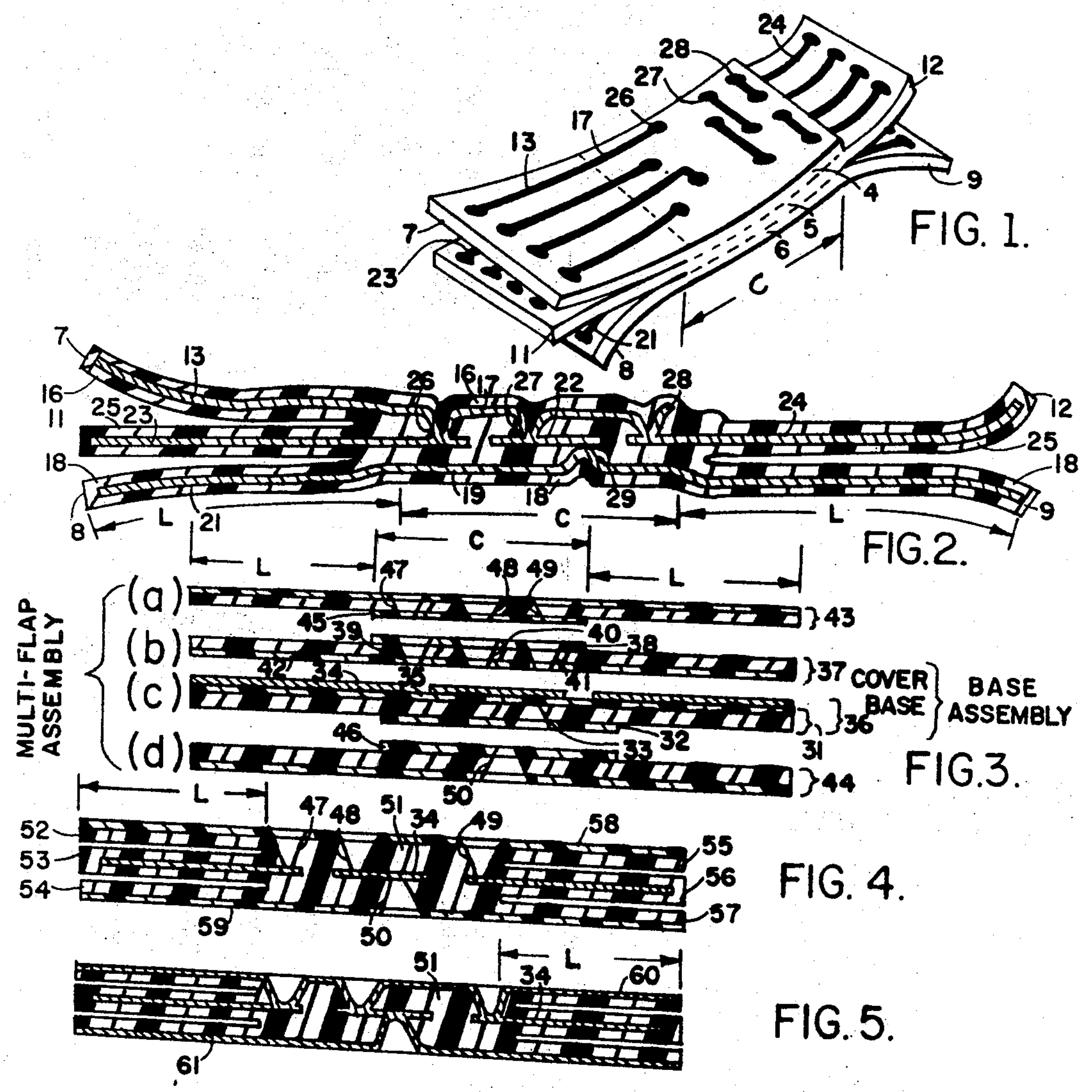
FIG. 1 illustrates the three-dimensional circuit matrix with a multitude of take-off lead flaps extending from two sides thereof.
FIG. 2 is a sectional view taking through the matrix circuit and flaps to illustrate the layers of dielectric separating circuit layers and the electrical connections between layers and to the flaps.
FIGS. 3 to 6 illustrate section views of the multi-flap matrix at successive steps of fabrication as an aid to understanding the method of making the circuit with two flaps of leads extending from each circuit layer.
Figure 6:
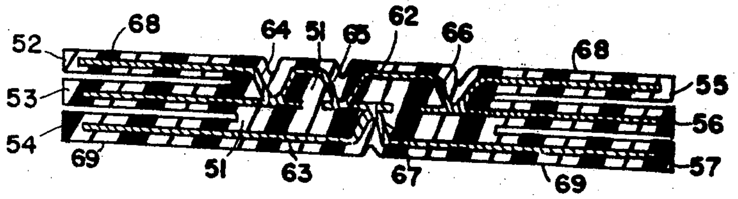

Turning first to FIG. 1, there is shown a three-dimensional circuit matrix with a plurality of take-off lead flaps extending from two sides thereof. The circuit matrix extends along the dimension C and in the embodiment illustrated is composed of three layers 4, 5 and 6. The layer 4, which will be referred to herein as the top layer, includes a single take-off lead flap 7 which extends from one edge of the layer. The bottom layer 6 includes two take-off lead flaps 8 and 9 which extend from opposite edges, and the middle layer 5 also includes two take-off lead flaps 11 and 12 which extend from opposite edges. Thus, each circuit layer has at least one take-off lead flap carrying leads such as lead 13 from the electrical conductors contained in the circuit layer. The embodiment shown in FIG. 1 and illustrated in detail in FIG. 2 is selected for description because it shows construction with a maximum number of take-off flaps on one side and less than the maximum number on another side.

FIG. 2 is a sectional view of the circuit matrix and take-off flaps taken for example along the conductor 13 transverse to the flaps and circuit layers. As shown, the upper circuit layer 4 is comprised of a dielectric strip 16 which seals and insulates the underlying circuit 17 formed by electrolytic plating of copper conductors with the take-off leads such as lead 13 extending therefrom. This upper circuit layer and leads is formed by electrolytic plating so that simultaneously holes in the dielectric material of layers 4 and 5 which are in registry are plated to provide connections between the layers 4 and 5. The dielectric strip 16 may be, for example, a polyimide-Teflon FEP laminate such as the DuPont product Kapton. The lower circuit layer 6 with the flaps 8 and 9 extending therefrom is formed in substantially the same manner and at the same time, and includes a strip 18 of the dielectric carrying the copper circuit conductors 19 and leads such as 21.

The middle circuit layer 5 and take-off lead flaps 11 and 12 may be formed in the same manner as the outer two layers, or it may be formed in any other suitable manner. The middle layer includes circuit conductors 22 from which extend leads such as 23 and 24 encased within dielectric material 25. This dielectric material is preferably the same as the material of the strips 16 and 18 in which the outer circuits are formed, and so all dielectric material is shown as a continuous substance. However, the material need not be the same but must be capable of sealing with whatever sealing material is employed between dielectric strips. In the example illustrated, since the sealing material between dielectric strips is Teflon, this must be capable of sealing with Teflon under the same conditions that Teflon seals to the polyimide. Accordingly, fabrication is facilitated by employing the same polyimide-Teflon laminate to form the circuit layer 5 as is employed to form the outer two circuit layers and flaps.

The electrical connections 26 to 29 between the circuit layers are effected at the same time the outer circuit layers 17 and 19 are laid down. Suitable holes which extend through the outer dielectric strips are plated to provide these connections.

A substantial length denoted L of each of the outer flaps 7 and 8 is free to move relative to the middle flap 11. Similarly, flaps 9 and 12 are free to move relative to each other. The dielectric material between flaps insures a seal and provides sufficient strength to prevent the adjacent flaps from tearing apart during ordinary manipulation in use. The method of construction and fabrication of the circuit matrix and take-off flaps described below insures that such a bond is obtained and insures that insulation is maintained between the circuit layers and leads.

Turning next to FIGS. 3 to 6, there is shown a method of making the three-dimensioned circuit matrix with a multitude of lead flaps extending from two sides thereof. In the preferred embodiment, laminates of polyimide-Teflon sold under the trade name Kapton are employed. These laminates consist of a .001 inch layer of FEP and a .003 inch layer of H film. As already mentioned, the FEP fuses at a temperature somewhat lower than the H film.

The first steps of fabrication are illustrated in FIG. 3. More particularly, as shown in FIG. 3*c*, a base strip 31 of Kapton has fused to the center portion thereof, along the dimension C of the H film layer, a .001 inch layer 32 of FEP. Next a hole 33 is punched at a selected position along the circuit portion C. Then a layer 34 of copper foil is fixed to the opposite surface of the strip 31 of Kapton contiguous with the FEP layer 35 thereof. Then the circuit and leads such as circuit 22 and leads 23 and 24 shown in FIGS. 1 and 2 are formed in the copper foil. This may be accomplished by, for example, coating the foil with an etchant resist material such as Kodak KPR; then exposing the etchant resist material to a light pattern of the circuit 22 and leads 23 and 24 so that, upon developing, etching and washing, the layer 34 of base circuit 36 and leads are formed.

Another strip of Kapton 37 serves as the base cover layer. A length C of .001 inch FEP 38 is fused to strip 37, and suitably disposed holes 39 to 41 are punched in this. Then the cover 37 and base 36 layers are stacked one upon the other as shown to form the base assembly, and heat is applied, fusing the layer FEP 42 therebetween so that the electrical circuit layer and leads 34 are encapsulated by the dielectric.

Next the upper and lower cover layers shown in FIGS. 3*a* and 3*d* are formed. These include strips of Kapton 43 and 44 with sections 45 and 46 of length C of .001 inch FEP fused to the center part thereof. Then holes are punched at the center parts of each of these covers in registry with the holes in the base assembly immediately adjacent thereto. Thus, holes 47 to 49 in the upper cover are in registry with holes 39 to 41, and the hole 50 in the lower cover is in registry with hole 33. The upper and lower covers are then assembled with the base assembly and heat is applied, just sufficient to fuse the layers 38 and 45 and 32 and 46 of EFP so as to seal the upper and lower covers to the base assembly along the circuit section C, leaving the flap sections L of the outer covers free and movable relative to the base assembly.

The assembled and fused base assembly and upper and lower covers are illustrated in FIG. 4. In this figure the layers which are fused and serve to attach the layers of H film are not distinguished. Instead, a continuous mass of H film 51 is shown encapsulating the circuit layer 34 and forming a multitude of flaps 52 and 57 where the contiguous layers of H film are not sealed. The H films do not seal along the dimensions L because there is no FEP layer therebetween and, as already noted, the fusing temperature of FEP is sufficiently below the fusing temperature of H film so that the FEP may be caused to fuse without fusing the H film.

Next, the top and bottom of surfaces which are covered with layers of FEP 58 and 59, along with the holes 47 to 50 which extend from these surfaces to the circuit layer 34, are etched with sodium in preparation for the metallizing step. FIG. 5 shows the surfaces so treated. The upper surface is denoted 60, and the lower surface is denoted 61.

The treated surfaces 60 and 61 shown in FIG. 5 are preferably metallized employing the Shipley method. Thus, the surfaces 60 and 61 are metallized by means of electrolytic copper plating. Then an etchant resist material such as Kodak KPR is applied to each of these metallized surfaces, and the resist material is exposed to light patterns defining the upper and lower circuit layers and leads thereto, such as the circuit layers 17 and 19 with associated leads shown in FIG. 2. The etchant resist is then developed and washed with acid. This leaves the upper and lower circuit layers 62 and 63 shown in FIG. 6 with connections 64 to 67 between each of these layers and the base layer 34 via the holes 47 to 50 which are plated upon application of the above-mentioned metallizing operation.

The last step is to apply insulating layers 68 and 69 to the outer circuit layers. This may be accomplished with a cover coat of 1–3 H, FEP or any other suitable flexible sealing material.

Figure 7:
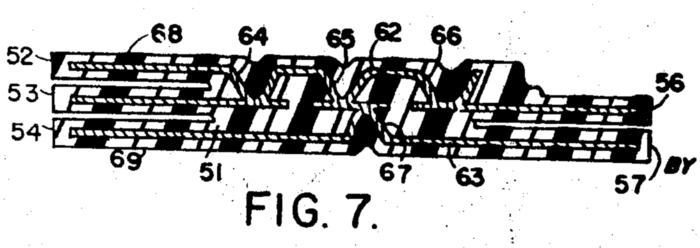
FIG. 7 is a sectional view illustrating the last step in making a multi-flap matrix in which one circuit layer carries but a single flap of leads.

The method described above is suitable for making a three-dimensional circuit matrix with any number of lead flaps extending in one, two or even more directions therefrom. The example described illustrates fabrication of a three-layer matrix with six lead flaps, two lead flaps from each of the layers. The same steps would be employed, for example, to make a three-layer matrix for which one or both of the outer layers has but a single lead flap, such as shown in FIGS. 1, 2 and 7. Here, the method of making would be the same as outlined above except that the upper cover layer shown in FIG. 3*a* would not include the right-hand portion L of Kapton strip 43, and so the length of this cover layer would be $L+C$ rather than $2L+C$, but with a sufficient length of Kapton material extending beyond the dimension material C to insure that the upper circuit layer is sealed to the base assembly.

Another method of fabricating the multi-flap matrix of the present invention, and that which is preferred, will herein be described with particular reference to FIGS. 8 through 12, wherein similar parts are denoted by similar reference numerals.

Figure 8:
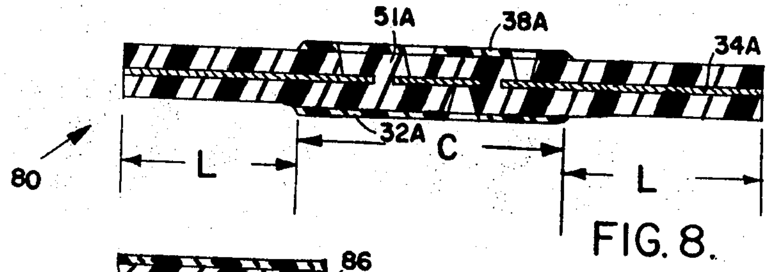
FIGS. 8 to 12 illustrate section views of the multi-flap matrix at successive steps of fabrication as an aid to understanding another method of making the multi-flap matrix assembly shown in FIG. 1.
Figure 9:
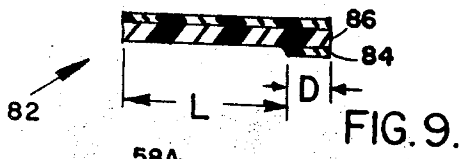

In FIG. 8 there is shown a completed base assembly 80, similar to the base assembly 36, 37 shown in FIG. 3, and fabricated in the same manner as hereinbefore described.

Figure 10:
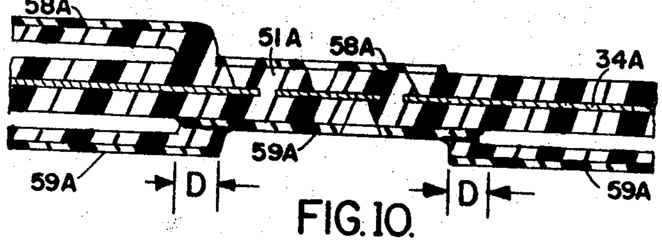
Figure 11:
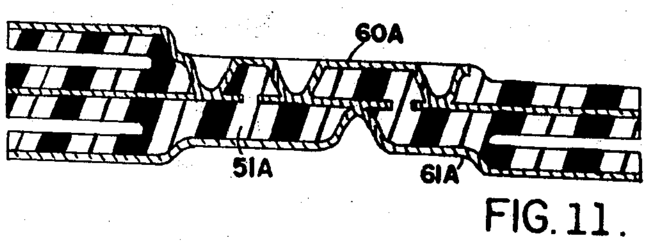

The next step in this fabrication of said matrix is to fuse the flap portion 82 (shown in FIG. 9) to the base assembly 80 along the dimension D to form the assembly shown in FIG. 10; it will be noted that three flap portions 82 are fused to said base assembly 80. The flap portions consist of a strip of Kapton whose length is $L+D$ and a small layer 84, length D, of FEP fused to the H layer 86 of said strip along the inner edge thereof.

Next the top and bottom surfaces of the matrix assembly (as seen in FIG. 10), which have layers of FEP 58A and 59A respectively, are etched with sodium in preparation for the metallizing step.

Figure 12:
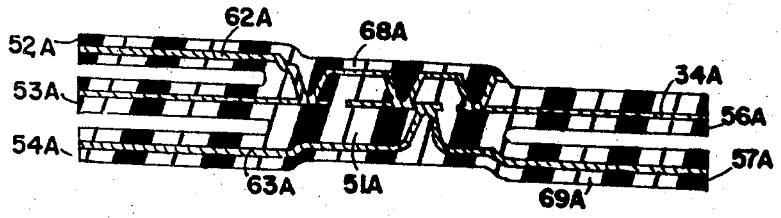

After the metallizing step, the metallized surfaces 60A and 61A (shown in FIG. 11) are resisted, developed, etched and washed, as previously described, to form the upper and lower circuit layers 62A and 63A, respectively, as shown in FIG. 12.

The last step is to apply insulating layers 68A and 69A to the outer circuit layers to form the multi-flap matrix depicted in FIGS. 1 and 12. The insulating layers 68A and 69A are preferably formed of 1–3 H, FEP material.

It is herein to be noted that the flaps composed of flap portions 82 are free to move relative to the flaps formed by the base assembly 80, while still being securely connected to the circuit matrix; also, the thickness of said circuit matrix formed herein is substantially less than that formed by the first method of the invention.

It will be apparent to those skilled in the art that, although the multi-flap matrix assembly has herein been described as having three flaps on one side thereof and two flaps on the other side thereof, the same may be fabricated having three flaps on each side thereof, i.e., either an equal or an unequal number of flaps on each side thereof.

This completes the description of various embodiments of the present invention and methods of fabrication. The methods of fabrication described relate only to the end product as described herein. This end product is a three-dimensional circuit matrix composed of a multitude of circuit layers with at least one take-off lead flap extending from each layer and with all leads and circuit conductors preferably encapsulated with an insulating dielectric material. The specific details of methods and means of construction described herein are made by way of example and do not limit the spirit and scope of the invention as set forth in the accompanying claims.

We claim:

1. A method for making a three-dimensional circuit matrix comprising the steps of forming a base circuit layer and leads extending therefrom, encapsulating said base circuit layer and leads in a base strip of substantially flexible dielectric material of given length, whereby said circuit layer occupies the central portion of said base strip, attaching upper and lower cover strips of substantially flexible dielectric material to opposite faces of said base strip along only the central portions thereof thereby leaving the ends of said cover strips unattached, forming outer circuit layers and leads on the outside faces of said cover strips with said outer circuit layers occupying portions in overlying registry with said central portion of said base strip, interconnecting various of said circuit layers, and covering said outer circuit layers and leads with strips of flexible dielectric material and adhering same thereto, whereby adjacent layers of leads are encapsulated in separate layers of dielectric material forming independently movable flaps which extend from the three-dimensional circuit matrix.

2. A method as in claim 1 and further including the following steps, before forming said base circuit layer and leads, forming holes in the strip of dielectric which comprises said base strip, and before attaching said upper and lower cover strips, forming holes therein in registry with said base strip holes, whereby electrical connectors are formed extending through said holes from said outer circuit layers to said base circuit layer.

3. A method as in claim 2 in which said outer circuit layers and leads are formed by means of electrolytic deposition of metal on the outside faces of said upper and lower cover strips and in said holes.

whereby said outer circuit layers, leads and said electrical connectors extending through said holes are simultaneously formed.

4. A method as in claim 1 in which said base strip is formed of a pair of strips of polyimide-teflon laminate, and wherein said outer cover strips are each formed of polyimide-teflon laminates.

5. A method for making a three-dimensional circuit matrix comprising the steps of forming a base circuit layer and leads extending therefrom, encapsulating said base circuit layer and leads in a base strip of substantially flexible dielectric material of given length, whereby said circuit layer occupies the central portion of said base strip, attaching at least one upper and at least one lower flap strip of substantially flexible dielectric material to opposite faces of said base strip along the outer edges of the central portion thereof thereby leaving the ends of the flaps unattached, forming outer circuit layers and leads on the outside faces of said flap and base strips with said outer circuit layers occupying portions in overlying registry with said central portion of said base strip, interconnecting various of said circuit layers and covering said outer circuit layers and leads with strips of flexible dielectric material and adhering same thereto, whereby adjacent layers of leads are encapsulated in separate layers of dielectric material forming independently movable flaps which extend from the three-dimensional circuit matrix.

6. A method as in claim 5 and further including the following steps before forming said base circuit layer and leads, forming holes in the strip of dielectric which comprises said base strip, whereby electrical connectors are formed extending through said holes from said outer circuit layers to said base circuit layer.

7. A method as in claim 6 in which said outer circuit layers and leads are formed by means of electrolytic deposition of metal on the outside faces of said flap and base strips and in said holes, whereby said outer circuit layers, leads and said electrical connectors extending through said holes are simultaneously formed.

8. A method as in claim 5 in which said base strip is formed of a pair of strips of polyimide-teflon laminate, and wherein said outer cover strips are each formed of polyimide-teflon laminate.

9. A method for making a three-dimensional circuit matrix according to claim 5 in which the step of attaching includes the preparatory step of fusing a layer of a thermoplastic resin to the central portions only of each of said upper and lower cover strips and said base circuit layer.

10. A method for making a three-dimensional circuit matrix according to claim 5 in which the step of attaching includes the preparatory step of fusing a layer of a thermoplastic resin to each side of the central portion only of said base circuit layer and to the inner edges only of said upper and lower flaps.

References Cited

UNITED STATES PATENTS

| | | | |
|---|---|---|---|
| 3,009,010 | 11/1961 | Stearns et al. | 339—17X |
| 3,221,095 | 11/1965 | Cook | 339—17X |
| 3,264,402 | 8/1966 | Shaheen et al. | 317—101 |
| 3,319,317 | 5/1967 | Roche et al. | 317—101X |
| 3,353,263 | 11/1967 | Helms | 29—626 |

JOHN F. CAMPBELL, Primary Examiner

R. W. CHURCH, Assistant Examiner

U.S. Cl. X.R.

174—68.5; 317—101; 339—17, 175; 204—15